(12) United States Patent
Bronner et al.

(10) Patent No.: US 8,039,888 B2
(45) Date of Patent: Oct. 18, 2011

(54) CONDUCTIVE SPACERS FOR SEMICONDUCTOR DEVICES AND METHODS OF FORMING

(75) Inventors: Gary Bela Bronner, Stormville, NY (US); David Michael Fried, Brewster, NY (US); Jeffrey Peter Gambino, Westford, VT (US); Leland Chang, New York, NY (US); Ramachandra Divakaruni, Ossining, NY (US); Haizhou Yin, Poughkeepsie, NY (US); Gregory Costrini, Hopewell Junction, NY (US); Viraj Y. Sardesai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 709 days.

(21) Appl. No.: 11/848,597

(22) Filed: Aug. 31, 2007

(65) Prior Publication Data
US 2008/0272398 A1 Nov. 6, 2008

Related U.S. Application Data

(62) Division of application No. 11/308,604, filed on Apr. 11, 2006.

(51) Int. Cl.
*H01L 29/788* (2006.01)
*H01L 21/336* (2006.01)

(52) U.S. Cl. .................................... 257/316; 438/267
(58) Field of Classification Search .............. 438/230, 438/233, 266, 267; 257/382, 316, 319
See application file for complete search history.

(56) References Cited

U.S. PATENT DOCUMENTS

| | | | |
|---|---|---|---|
| 6,140,171 A * | 10/2000 | Allen et al. .................. 438/230 |
| 6,200,839 B1 | 3/2001 | Batra et al. .................. 438/180 |
| 6,222,753 B1 | 4/2001 | Goebel et al. ................. 365/63 |
| 6,309,930 B1 | 10/2001 | Goebel et al. ............... 438/270 |
| 6,320,235 B1 | 11/2001 | Cheffings |
| 6,380,590 B1 * | 4/2002 | Yu ................................ 257/350 |
| 6,566,208 B2 * | 5/2003 | Keung et al. ................. 438/300 |
| 2004/0188749 A1 | 9/2004 | Chang et al. |
| 2005/0023133 A1 * | 2/2005 | Lippitt et al. ............ 204/192.25 |
| 2005/0040456 A1 | 2/2005 | Specht et al. |
| 2005/0040470 A1 | 2/2005 | Chuang et al. |
| 2005/0145977 A1 | 7/2005 | Alessandria et al. |
| 2005/0287759 A1 * | 12/2005 | Wang et al. .................. 438/400 |
| 2007/0202675 A1 | 8/2007 | Srivastava |

* cited by examiner

*Primary Examiner* — Calvin Lee
(74) *Attorney, Agent, or Firm* — Wenjie Li

(57) ABSTRACT

A method of forming a conductive spacer on a semiconductor device. The method includes depositing a polysilicon layer on the semiconductor device, selectively implanting dopant ions in the polysilicon layer on a first side of a transistor region of the semiconductor device to define a conductive spacer area, and removing the polysilicon layer except for the conductive spacer area. Optionally, a silicidation process can be performed on the conductive spacer area so that the conductive spacer is made up of metal silicide.

8 Claims, 5 Drawing Sheets

CONDUCTIVE SPACERS FOR SEMICONDUCTOR DEVICES AND METHODS OF FORMING

CROSS REFERENCE TO RELATED APPLICATIONS

This application is a divisional application of U.S. application Ser. No. 11/308,604 filed Apr. 11, 2006, now pending.

BACKGROUND OF THE INVENTION

The present invention relates generally to the field of semiconductors and semiconductor manufacturing. More particularly, the present invention relates to semiconductor devices using conductive spacers for use in an SRAM cell layout, and methods of forming such spacers.

The dimensions of semiconductor devices are shrinking rapidly, while circuit complexity and density continue to increase. Any innovation with the potential to reduce the size of semiconductor devices is desirable. In particular, methods of reducing Static Random Access Memory (SRAM) cell size are in great demand. However, the increase in complexity and decrease in size has made such reductions increasingly difficult to achieve.

A limiting factor for the shrinking of SRAM cells has been the need for interconnects formed on one or more metallization layers above the semiconductor device. Typically, a layer of highly conductive metal is deposited on top of the semiconductor device and patterned to form the desired interconnects between contacts on the device.

Accordingly, it has been proposed to decrease the size of semiconductor devices, in particular SRAM cells, by using local interconnects, that is, connections that lie within the cell. Most of the prior art methods for creating local interconnects are costly and complicated.

Therefore, there is a need for methods and structures that overcome one or more of the deficiencies of prior art methods.

BRIEF DESCRIPTION OF THE INVENTION

A method of forming a conductive spacer on a semiconductor device is provided. The method includes depositing a polysilicon layer on the semiconductor device, selectively implanting dopant ions in the polysilicon layer on a first side of a transistor region of the semiconductor device to define a conductive spacer area, and removing the polysilicon layer except for the conductive spacer area.

An SRAM cell is also provide that includes a transistor region having a non-conductive spacer on a first side, a metallization layer, and a conductive spacer. The conductive spacer is defined on the non-conductive spacer and the conductive spacer forms a cross couple connection below the metallization layer.

A semiconductor device is provided including a semiconductor substrate, an n-FET region disposed on the substrate, a p-FET region having a first side and a second side, the p-FET region being disposed on the substrate, and a conductive spacer defined on the first side of the p-FET region.

The above-described and other features and advantages of the present invention will be appreciated and understood by those skilled in the art from the following detailed description, drawings, and claims.

DETAILED DESCRIPTION OF THE INVENTION

Figure 1:
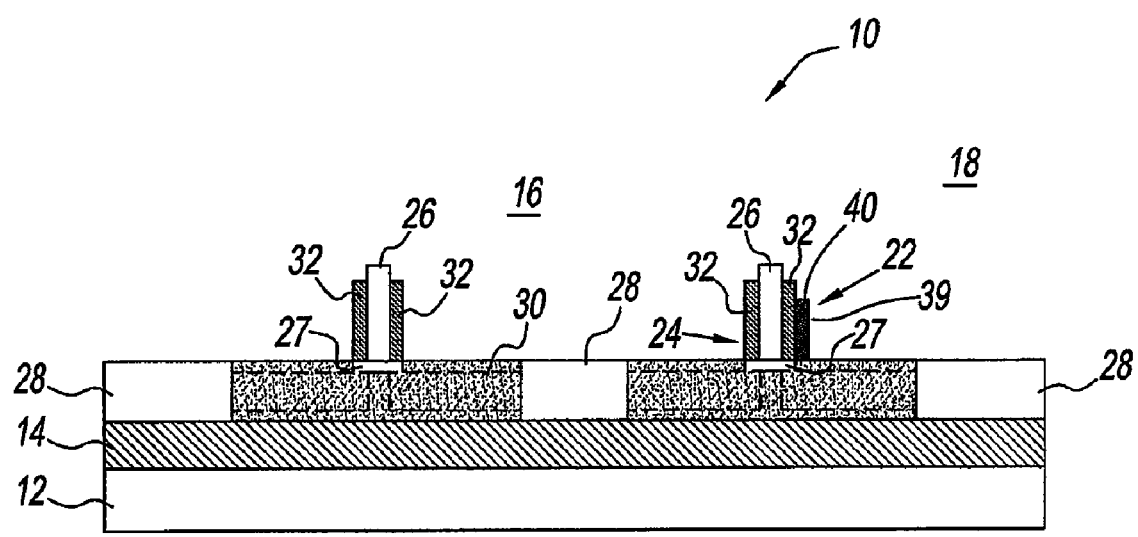
FIG. 1 is a schematic depiction showing a cross-sectional view of a semiconductor device with a conductive spacer according to the present invention.

Referring now to the drawings and in particular to FIG. 1, an exemplary embodiment of a semiconductor device of the present invention is illustrated as reference number 10.

Semiconductor device 10 includes a substrate 12, an n-channel field effect transistor (n-FET) region 16, and a p-channel field effect transistor (p-FET) region 18. Preferably, n-FET region 16 and p-FET region 18 are separated from the bulk of substrate 12 by an embedded buried oxide (BOX) layer 14. The BOX layer 14 eliminates leakage current between devices and reduces parasitic capacitance associated with source/drain regions 30 of the semiconductor device. For clarity, semiconductor 10 is shown with one n-FET region 16 and one p-FET region 18. However, it is contemplated by the present disclosure for semiconductor device 10 to include any number of transistor regions.

Both n-FET region 16 and p-FET region 18 include a gate material 26 overlying a gate dielectric 27, and source/drain regions 30 surrounding each transistor regions 16, 18. Preferably, gate material 26 is a polycrystalline silicon (polysilicon) material, but may comprise any conductive material. Substrate 12 is preferably silicon, but may be any semiconducting material or a layered substrate including at least one semiconducting material. Preferably, shallow trench isolation structures 28 are disposed above buried oxide layer 14 and between source/drain regions 30 of n-FET regions 16 and p-FET regions 18 to isolate each transistor region from adjacent transistor regions, thus preventing current leakage.

Both n-FET region 16 and p-FET region 18 have a pair of nonconductive spacers 32 on opposite sides of the transistor region. Nonconductive spacers 32 are preferably made of silicon nitride, but may alternatively be made silicon oxide or other insulating materials.

Advantageously, semiconductor device 10 includes a conductive spacer 40 disposed on a first side 22 of p-FET region 18. Specifically, conductive spacer 40 is adjacent to a nonconductive spacer 32 disposed on the first side 22 of the p-FET region. Conductive spacer 40 may comprise any conductive material, including metals and metal silicides. Preferably, conductive spacer 40 is a metal silicide, and most preferably nickel silicide. Alternatively, conductive spacer 40 may be any metal or metal silicide, including cobalt silicide, tungsten silicide, tungsten, niobium, tantalum, and aluminum.

The exemplary embodiment of the present invention illustrated in FIG. 1 shows conductive spacer 40 adjacent to a first side 22 of p-FET region 18. However, the present disclosure also contemplates locating conductive spacer adjacent to either p-FET region 18 or n-FET region 16, and on any side of the transistor regions.

Figure 2:
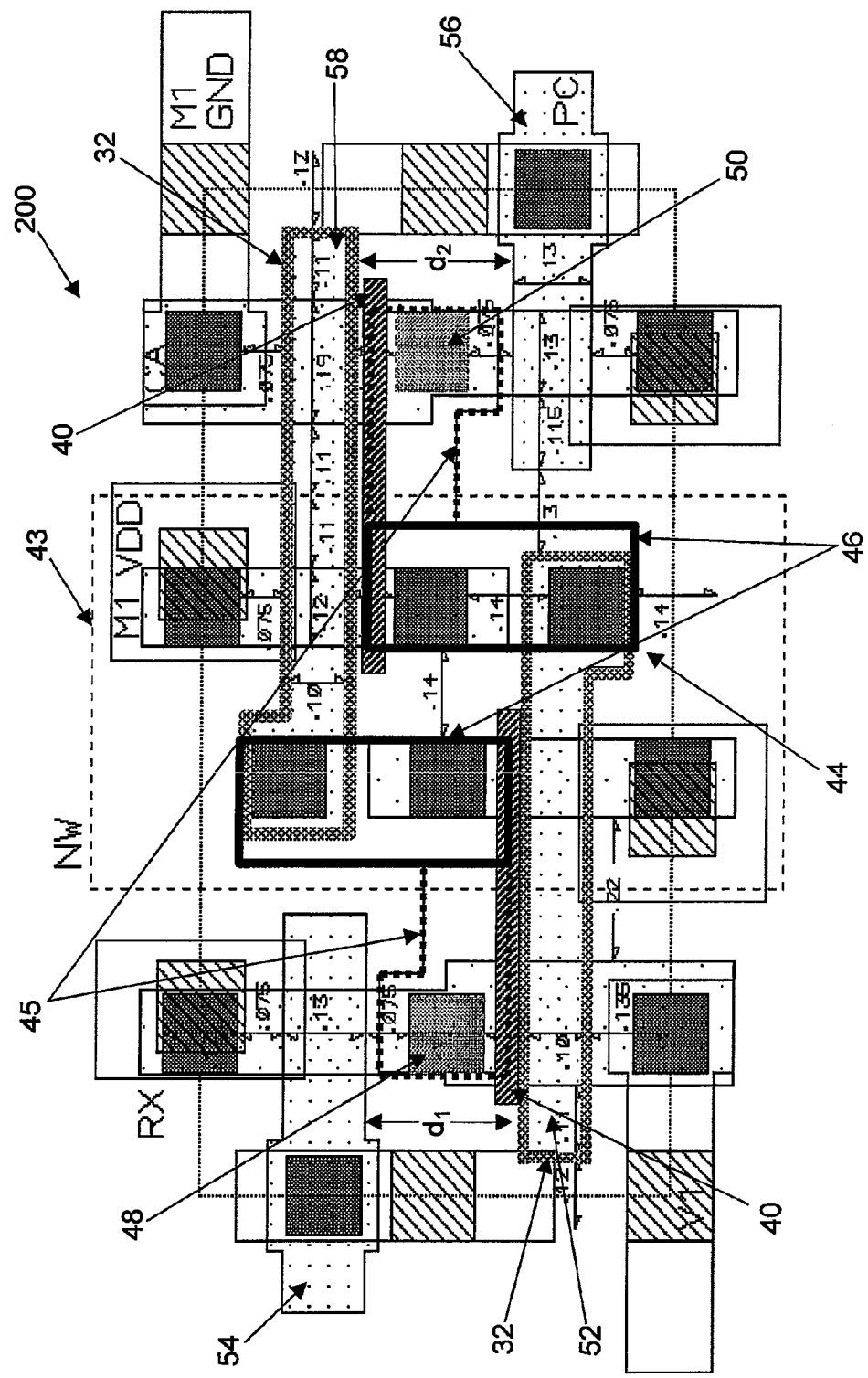
FIG. 2 illustrates an SRAM cell layout utilizing the conductive spacer of the present invention.
Figure 3:
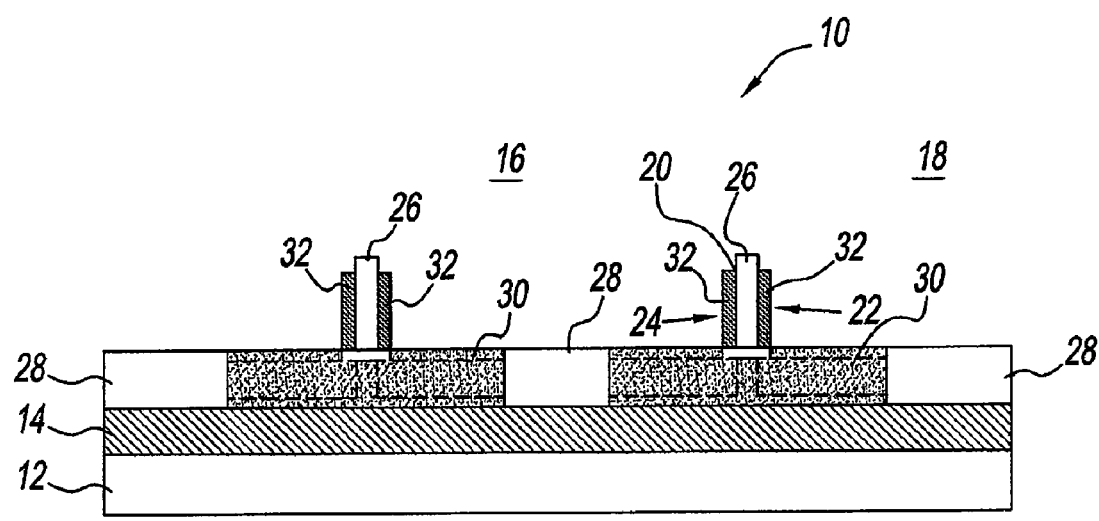
FIG. 3 is a schematic depiction showing a cross-sectional view of a semiconductor device according to the present invention, after formation of an n-FET gate region and a p-FET gate region.

Semiconductor device 10 can form part of SRAM cell 200, as shown in FIG. 2. Advantageously, conductive spacer 40 functions as a cross coupling local interconnect formed below a metallization layer 44 of cell 200.

Referring now to FIG. 2, an SRAM cell 200 using the conductive spacers 40 of the present invention is illustrated. In a process well known in the art, metallization layers are applied to the surface above a semiconductor wafer 43 and selectively etched to produce interconnects between devices on the semiconductor wafer. Metallization layer 44 forms wiring structures 46 that serve as interconnects between contacts on semiconductor wafer 43. The wiring structures 46 formed by metallization layer 44 provide a constraint on the size of the cell layout. That is, to make the cell layout smaller, the wiring structures 46 must be reduced.

Advantageously, cell 200 reduces the size and complexity of the wiring structures 46, which in turn reduces cell complexity and allows for increased cell density. Use of conductive spacers 40 allows additional wiring structures 45 (shown in phantom) which are used in conventional SRAM cells, to be eliminated from cell 200. Use of conductive spacers 40 also eliminates the need for a first contact 48 and a second contact 50. Without additional wiring structures 45 and contacts 48 and 50, the distance $d_1$ between a first device 52 and a second device 54 on cell 200 can be reduced by approximately 5% to 50%. Similarly, the distance $d_2$ between a third device 56 and a fourth device 58 can be decreased by a comparable amount. Advantageously, use of conductive spacers 40 allow the total area of cell 200 to be reduced by approximately 5% to 15% in comparison to a conventional SRAM cell.

Figure 4:
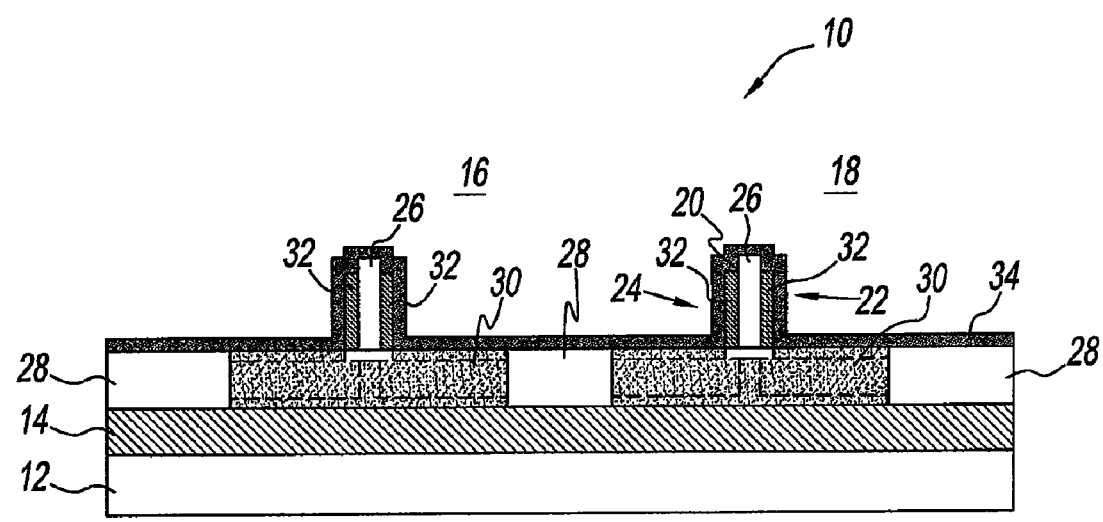
FIG. 4 illustrates the semiconductor device of FIG. 3, after application of a polysilicon layer to the semiconductor device.
Figure 5:
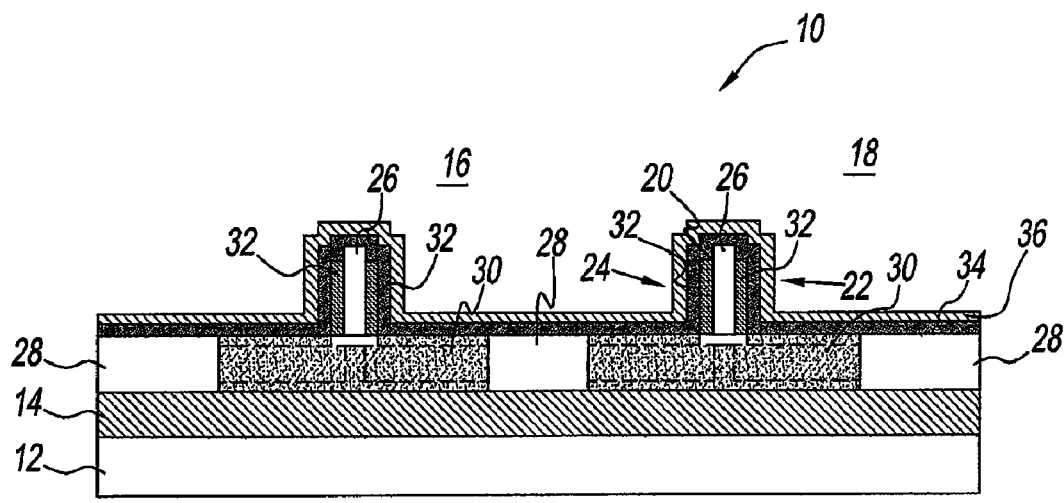
FIG. 5 illustrates the semiconductor device of FIG. 4, after application of a photoresist layer to the semiconductor device.
Figure 6:
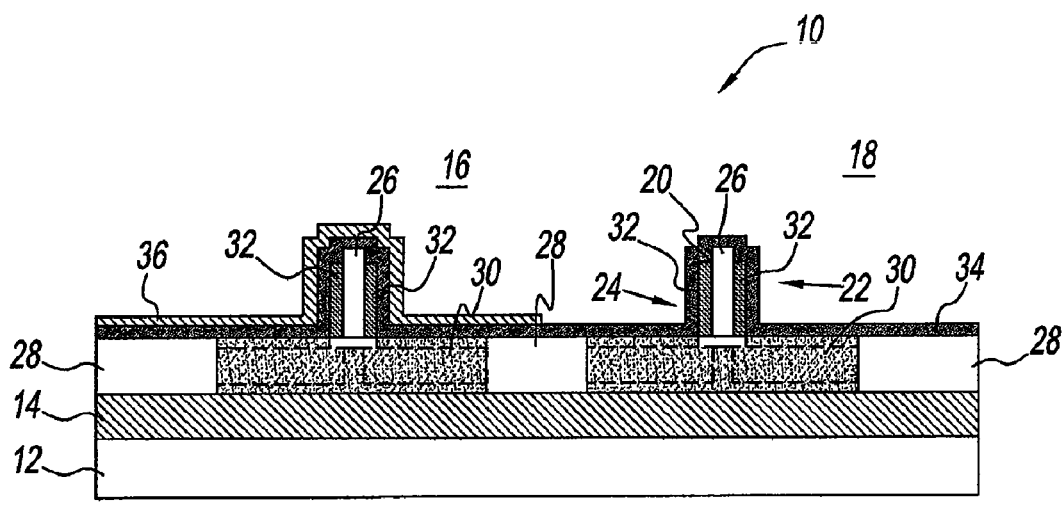
FIG. 6 illustrates the semiconductor device of FIG. 5, after the photoresist layer has been selectively developed to expose only the p-FET gate region.

Referring now to the drawings and in particular to FIGS. 3 through 8, an exemplary embodiment of the method of forming conductive spacer 40 of the present invention is illustrated. First, a deposition layer 34 is deposited on semiconductor device 10, as illustrated in FIG. 4. Deposition layer 34 is preferably a polysilicon deposition layer used to form conductive spacer 40. Next, a photoresist layer 36 is deposited over deposition layer 34, as shown in FIG. 5. Subsequently, photoresist layer 36 is selectively developed so as to cover only n-FET region 16, as shown in FIG. 6.

Figure 7:
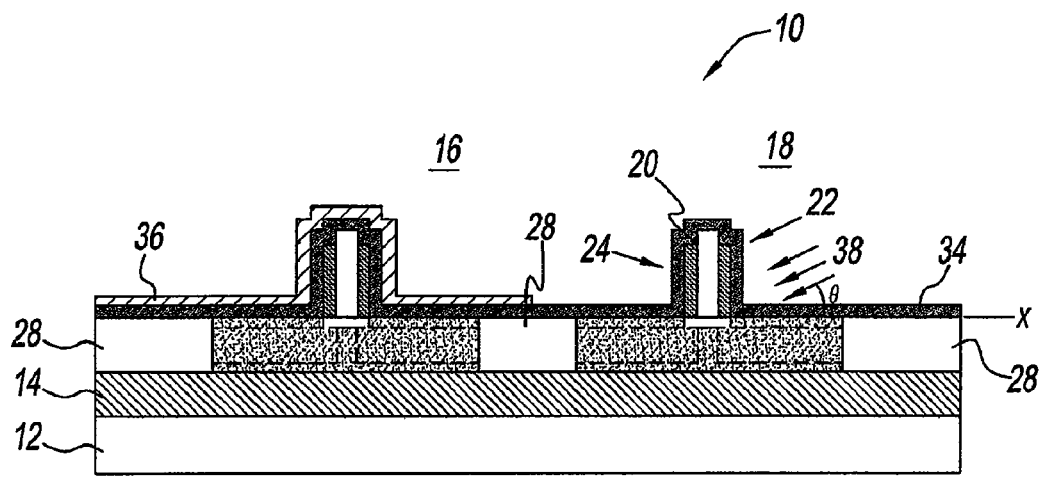
FIG. 7 illustrates the semiconductor device of FIG. 6 during an angled implantation of dopant ions to one side of the p-FET gate region.
Figure 8:
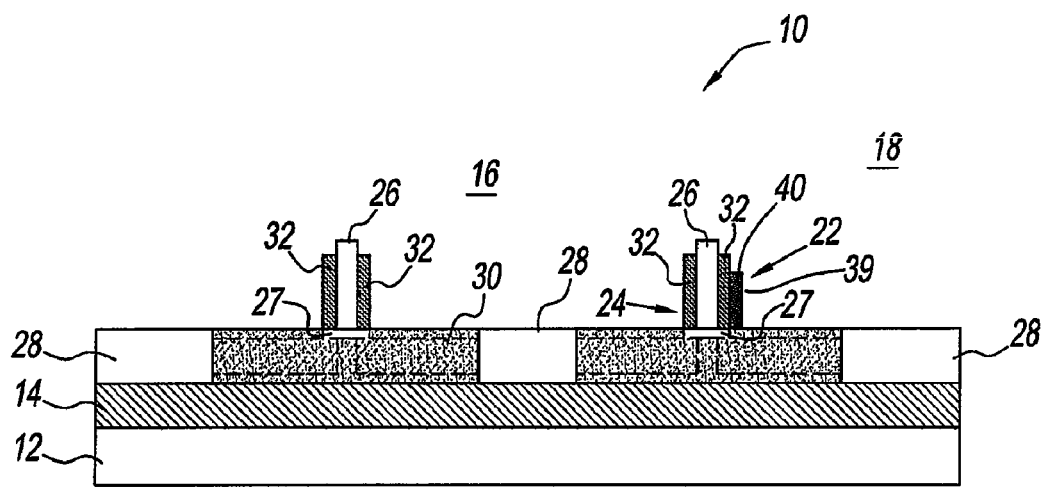
FIG. 8 illustrates the semiconductor device of FIG. 7 after silicide formation on the conductive spacer

Next, the first side 22 of p-FET region 18 is subjected to an implantation process 38 at an angle θ with respect to a horizontal axis x, as shown in FIG. 7. Implantation process 38 implants dopant ions in deposition layer 34. Implantation process 38 is preferably a boron implantation process. Alternatively, implantation process 38 may be an arsenic implantation process or any dopant-implanting process that allows for a subsequent selective etch process. Angle θ can be any angle that allows implantation process 38 to clear a neighboring gate structure (not shown) adjacent to p-FET region 18 while also providing a shadowing effect. That is, implantation process 38 should be implemented at an angle θ such that only the first side 22 of p-FET gate region 18 is subjected to implantation process 38, leaving a second side 24 of p-FET gate region 18, as well as any neighboring gate structures, unaffected by the implantation process. Preferably, angle θ is between approximately 15 and 60 degrees.

Subsequently, the remaining portion of photoresist layer 36 is removed, and an etching process is performed to remove deposition layer 34. The etching process is preferably a wet etch using potassium hydroxide (KOH), but may be any other suitable wet or dry etching process, such as a reactive ion etch. During the etching process, a conductive spacer area 39, that is, the portion of deposition layer 34 subjected to implantation process 38, does not etch, leaving conductive spacer 40 as shown in FIG. 1.

Finally, a silicidation process 42, well known in the art, such as a tungsten salicide process, a cobalt salicide process, or a nickel salicide process, may be performed on the polysilicon conductive spacer 40 to increase the conductivity and reduce the resistance of conductive spacer 40. Preferably, polysilicon conductive spacer 40 is combined with nickel to form nickel silicide.

The terms "first", "second", and the like may be used herein to modify various elements. These modifiers do not imply a spatial, sequential, or hierarchical order to the modified elements unless specifically stated.

While the present invention has been described with reference to one or more exemplary embodiments, it will be understood by those skilled in the art that various changes may be made and equivalents may be substituted for elements thereof without departing from the scope of the present invention. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A static random access memory cell comprising:
a semiconductor wafer having a contact;
a transistor region of the semiconductor wafer having a non-conductive spacer on a first side;
a metallization layer; and
a conductive spacer defined on the non-conductive spacer, the conductive spacer forming a cross couple connection with the contact of the semiconductor wafer below the metallization layer; wherein the conductive spacer is defined only on the non-conductive spacer at the first side.

2. A semiconductor device comprising:
a semiconductor substrate having a contact;
an n-FET region being disposed on the substrate;
a p-FET region having a first side and a second side, the p-FET region being disposed on the substrate;
a conductive spacer defined on the first side of the p-FET region; and
a metallization layer interconnecting the contact and the conductive spacer, the conductive spacer being below the metallization layer; wherein the conductive spacer is defined only on the first side of the p-FET region.

3. The semiconductor device of claim 2, further comprising a buried oxide layer.

4. The semiconductor device of claim 3, further comprising shallow trench isolation structures positioned between the n-FET and the p-FET regions.

5. The semiconductor device of claim 2, wherein the conductive spacer comprises polysilicon.

6. The semiconductor device of claim 2, wherein the conductive spacer comprises a metal silicide.

7. The semiconductor device of claim 2, wherein the conductive spacer comprises a material selected from the group consisting of cobalt silicide, tungsten silicide, and nickel silicide.

8. The semiconductor device of claim 2, wherein the conductive spacer comprises a material selected from the group consisting of tungsten, tantalum, niobium, and aluminum.

* * * * *